(12) United States Patent
Fujita et al.

(10) Patent No.: US 9,245,859 B2
(45) Date of Patent: Jan. 26, 2016

(54) WIRELESS MODULE

(71) Applicant: PANASONIC CORPORATION, Osaka (JP)

(72) Inventors: Suguru Fujita, Tokyo (JP); Ryosuke Shiozaki, Kanagawa (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/130,658

(22) PCT Filed: Dec. 4, 2012

(86) PCT No.: PCT/JP2012/007774
§ 371 (c)(1),
(2) Date: Jan. 2, 2014

(87) PCT Pub. No.: WO2013/084479
PCT Pub. Date: Jun. 13, 2013

(65) Prior Publication Data
US 2014/0145316 A1    May 29, 2014

(30) Foreign Application Priority Data

Dec. 5, 2011    (JP) .................................. 2011-266043
Dec. 7, 2011    (JP) .................................. 2011-268042

(51) Int. Cl.
*H01L 23/66*    (2006.01)
*H01P 5/02*    (2006.01)
(Continued)

(52) U.S. Cl.
CPC ................ *H01L 23/66* (2013.01); *H01L 23/13* (2013.01); *H01L 23/49827* (2013.01);
(Continued)

(58) Field of Classification Search
CPC ..................... H01L 2224/73265; H01L 23/12; H01L 2924/3011; H01L 2224/13082; H01L 23/49822
USPC ........... 257/698, E23.174, 659, E21.602, 664
See application file for complete search history.

(56) References Cited

U.S. PATENT DOCUMENTS 8,035,992 B2    10/2011    Kushta et al.
2001/0028114 A1*    10/2001    Hosomi ........................ 257/778
(Continued)

FOREIGN PATENT DOCUMENTS

JP    07-235565 A    9/1995
JP    2001-144244 A    5/2001
(Continued)

OTHER PUBLICATIONS

International Search Report, mailed Mar. 5, 2013, for PCT/JP2012/007774, 4 pages.

*Primary Examiner* — Cathy N. Lam
(74) *Attorney, Agent, or Firm* — Seed IP Law Group PLLC

(57) ABSTRACT

A wireless module includes a first board (2), in which an electronic component is mounted on one board (2a) and a ground layer (GND1) is formed on the other board (2b), a second board (3) which is laminated on the first board, a connecting member (8) which electrically connects the first board to the second board, a wiring pad (4) which electrically connects the first board to the connecting member, and a wiring pad (4b) which is provided on a bonded surface of the one board and the other board. A signal path of the connecting member has predetermined impedance which is determined depending on a distance between the second wiring pad and the ground layer.

5 Claims, 10 Drawing Sheets

(51) Int. Cl.
*H01P 5/08* (2006.01)
*H01L 23/13* (2006.01)
*H01L 23/498* (2006.01)
*H01Q 1/38* (2006.01)
*H01Q 9/04* (2006.01)
*H01Q 21/06* (2006.01)
H01L 23/31 (2006.01)
H01L 23/00 (2006.01)

(52) U.S. Cl.
CPC ... *H01L 23/49833* (2013.01); *H01L 23/49838* (2013.01); *H01P 5/028* (2013.01); *H01P 5/08* (2013.01); *H01Q 1/38* (2013.01); *H01Q 9/045* (2013.01); *H01Q 9/0407* (2013.01); *H01Q 9/0414* (2013.01); *H01Q 21/065* (2013.01); H01L 23/3121 (2013.01); H01L 24/16 (2013.01); H01L 24/32 (2013.01); H01L 2223/6677 (2013.01); H01L 2224/16225 (2013.01); H01L 2224/32225 (2013.01); H01L 2924/1423 (2013.01); H01L 2924/15153 (2013.01); H01L 2924/15192 (2013.01); H01L 2924/15311 (2013.01); H01L 2924/15321 (2013.01); H01L 2924/16172 (2013.01); H01L 2924/19041 (2013.01); H01L 2924/19042 (2013.01); H01L 2924/19043 (2013.01); H01L 2924/19105 (2013.01); H01L 2924/19106 (2013.01); H01L 2924/3011 (2013.01)

(56) References Cited

U.S. PATENT DOCUMENTS

| | | | |
|---|---|---|---|
| 2009/0133913 | A1 | 5/2009 | Kushta et al. |
| 2009/0267221 | A1 | 10/2009 | Fujii |
| 2012/0199972 | A1* | 8/2012 | Pagaila ............... H01L 21/6835 257/737 |
| 2013/0292809 | A1* | 11/2013 | Yoo .................... H01L 24/97 257/664 |

FOREIGN PATENT DOCUMENTS

| | | |
|---|---|---|
| JP | 2002-271101 A | 9/2002 |
| JP | 2004-205402 A | 7/2004 |
| JP | 2005-244010 A | 9/2005 |
| JP | 2009-266979 A | 11/2009 |
| WO | 2007-046271 A1 | 4/2007 |

* cited by examiner

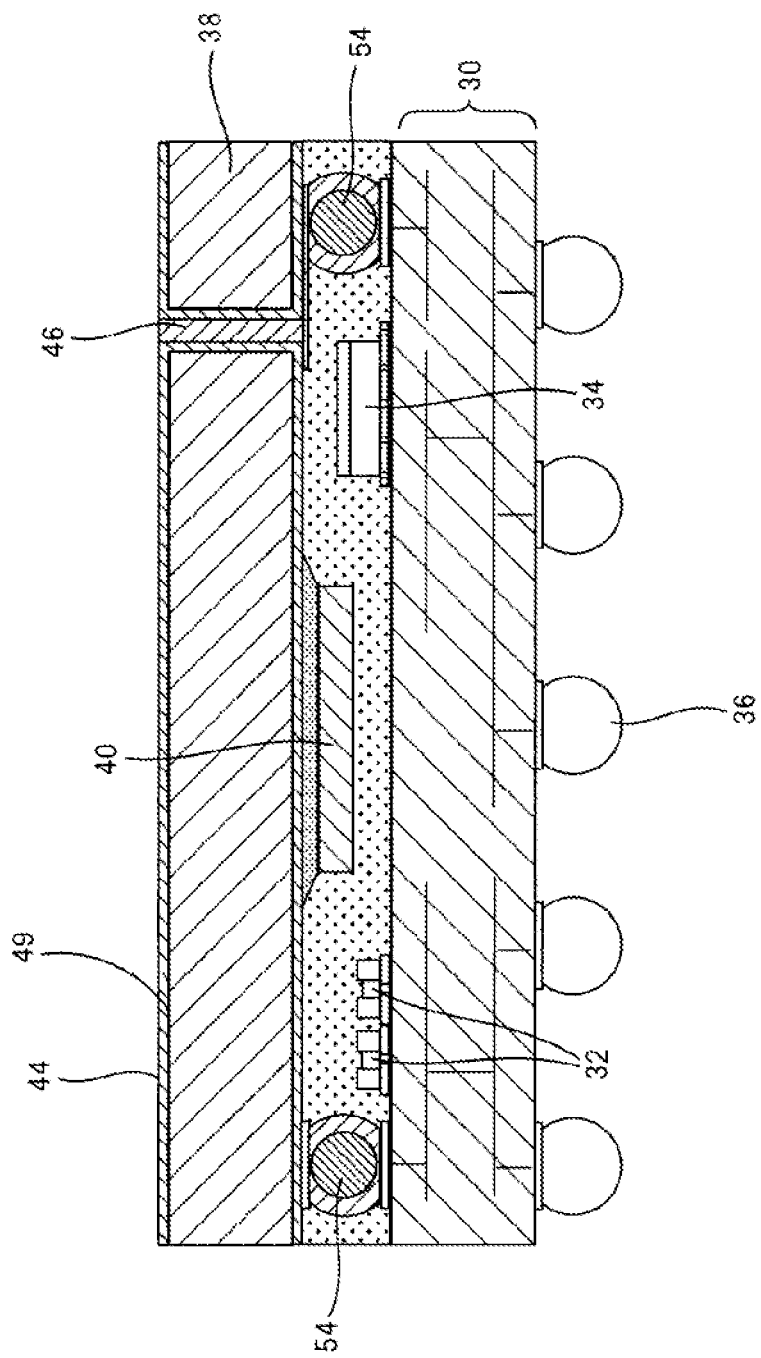

WIRELESS MODULE

TECHNICAL FIELD

The present disclosure relates to a wireless module which is used for wireless communication and has an electronic component mounted on a board.

BACKGROUND ART

As a circuit module for wireless communication having an electronic circuit mounted on a board, a circuit module is known, in which a board having an active device (for example, an integrated circuit (IC) mounted thereon and a board having a passive device (for example, a resistor, an inductor, or a conductor) mounted thereon are arranged to face each other and electrically connected together, and the space between the boards is sealed with resin.

For example, Patent Literature 1 discloses a semiconductor apparatus as a wireless module which uses a board having an antenna as a passive device mounted thereon and a board having a semiconductor device as an active device mounted thereon (see FIG. 11). FIG. 11 is a longitudinal cross-sectional view of a semiconductor apparatus of a related art.

In the semiconductor apparatus of Patent Literature 1, an antenna 44 is mounted on one surface of a silicon board 38, a semiconductor device 40 as an active device is mounted on the other surface of the silicon board 38, and the antenna 44 and the semiconductor device 40 are electrically connected together through a through-via 46 passing through the silicon board 38. A wiring board 30 formed separately from the silicon board 38 has passive devices 32, 34 mounted on one surface thereof, and the wiring board 30 and the silicon board 38 are electrically connected together through a connecting member 54 provided between one surface of the wiring board 30 and the other surface of the silicon board 38.

As a wireless module of the related art, a wireless module is known, in which a first board having an active device and a passive device mounted thereon and a second board having an antenna mounted thereon are arranged to face each other and electrically connected together by a connecting member. In this wireless module, a semiconductor device (for example, an IC) as an active device and a chip capacitor or a chip resistor as a passive device are mounted on the first board, and a connecting member, such as a solder-plated Cu (copper) core ball, is mounted on the second board. The mounting surfaces of the first board and the second board are arranged to face each other, the solder of the connecting member is molten and electrically connected to the first board, and mold resin as a seal material is filled in a buried layer having a component between the boards to seal the space between the boards with a seal. Accordingly, a wireless module in which a plurality of boards are laminated is completed.

CITATION LIST

Patent Literature

Patent Literature 1: JP-A-2009-2666979

SUMMARY OF INVENTION

Technical Problem

However, when manufacturing a high-frequency for example, a millimeter-wave band) wireless module using the wireless module of the related art, there is a problem in that impedance mismatching occurs due to the high frequency.

The present disclosure has been accomplished in consideration of the above-described situation in the related art, and an object of the present disclosure is to provide a wireless module capable of suppressing a signal loss due to impedance discontinuity and radiation when manufacturing a wireless module for a high-frequency band.

Solution to Problem

The present disclosure provides a wireless module including: a first board which includes at least two-layered boards, in which an electronic component of a wireless circuit is mounted on one board and a ground layer is formed on the other board; a second board which is arranged to be laminated on the first board; a connecting member which is provided between the first board and the second board at a gap allowing mounting of the electronic component, and electrically connects the first board and the second board; a first wiring pad which electrically connects the first board and the connecting member, and has a predetermined diameter; and a second wiring pad which is provided on a bonded face of the one board and the other board, and has a diameter smaller than the predetermined diameter of the first wiring pad, wherein a signal path of the connecting member has predetermined impedance which is determined depending on a distance between the second wiring pad and the ground layer.

Advantageous Effects of Invention

According to the present disclosure, when manufacturing a wireless module for a high-frequency band, it is possible to suppress a signal loss due to impedance discontinuity and radiation.

According to the present disclosure, even when an electronic component is mounted on an antenna mounting surface of a wireless module, the wireless module can be easily picked up from the antenna mounting surface.

BRIEF DESCRIPTION OF DRAWINGS

FIG. 11 is a longitudinal cross-sectional view of a semiconductor apparatus of a related art.

DESCRIPTION OF EMBODIMENTS

Figure 1:
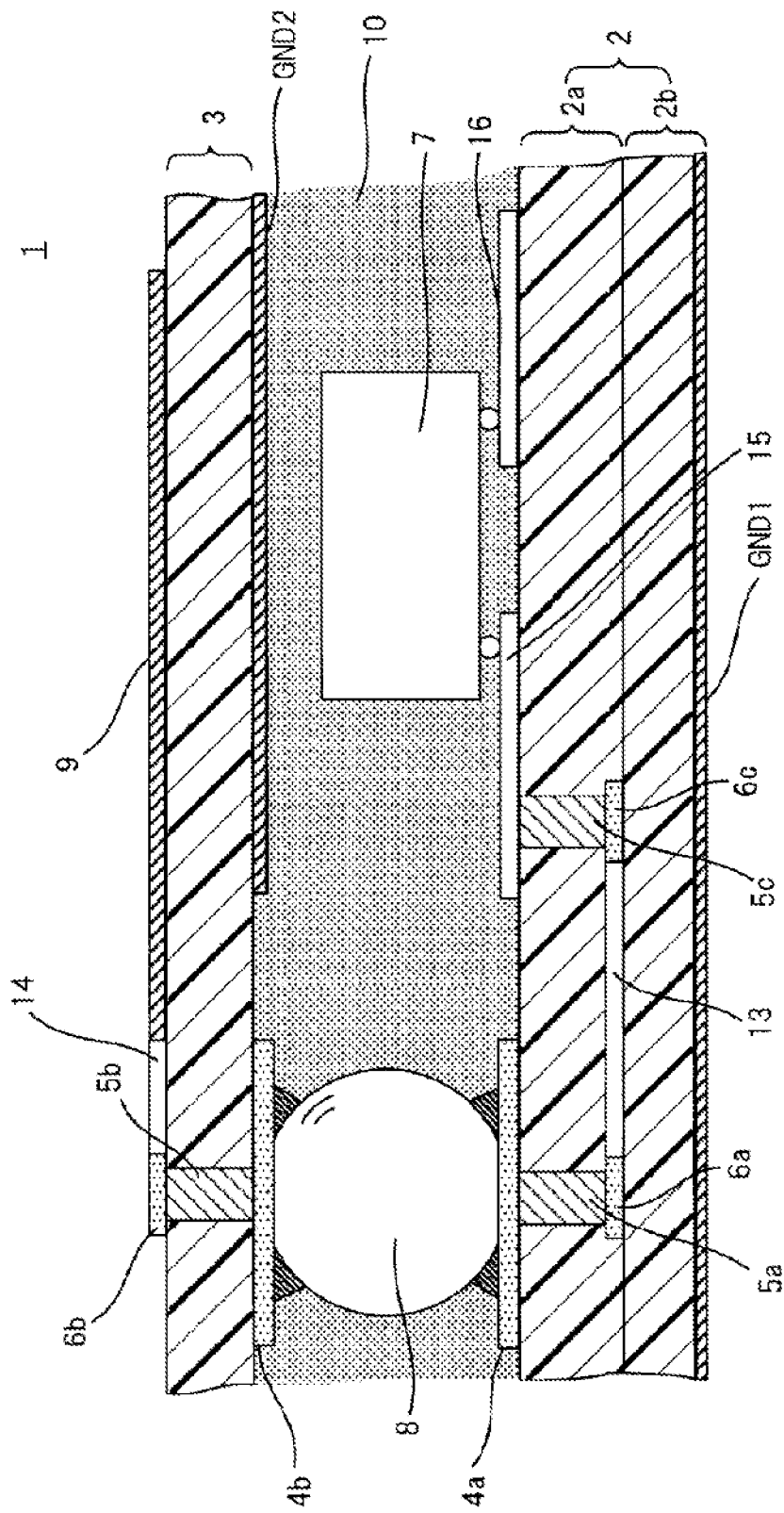
FIG. 1 is a longitudinal cross-sectional view of a wireless module according to a first embodiment.

Prior to describing an embodiment of a wireless module according to the present disclosure, the above-described problem will be described in detail. The problem is that, when manufacturing a wireless module for a high frequency (for example, a millimeter-wave band) using the wireless module of the related art, impedance mismatching occurs due to the high frequency.

In particular, at a high frequency in a millimeter-wave hand, the diameter of each of the connecting member, such as a Cu core ball, and the wiring pads provided on the first board and the second board having the connecting member mounted thereon increases with respect to the wavelength of a signal in wireless communication. Accordingly, impedance mismatching occurs, impedance discontinuity occurs between the input side and the output side, and a signal loss increases due to signal reflection or signal radiation.

For example, it is assumed that the thickness of a dielectric between a board having a layer of a signal line mounted thereon and a board having a ground (GND) layer mounted thereon is 50 [μm], and the dielectric constant of the dielectric, is about 3 to 4. In this case, the wiring width (signal line width) of 50 [Ω] impedance generally used as input/output impedance in the signal path of a high-frequency signal is substantially 50 [μm] or smaller than 50 [μm].

When a Cu core ball is used as a connecting member for connecting a plurality of boards together, the height of the electronic component (for example, a semiconductor device) mounted in the buried layer between the boards is, for example, 200 [μm]. In this case, the diameter of the Cu core ball is substantially 250 [μm], and the diameter of the wiring pad mounted on the board so as to electrically connect the Cu core ball and the board is equal to or greater than 250 [μm].

Accordingly, the diameter of the wiring pad is equal to or greater than five times the wiring width (50 [μm]) for realizing 50 [Ω] impedance. That is, a real component of impedance decreases, an imaginary component of impedance has a great capacitive component, and impedance between the wirings of the signal path is discontinuous, causing the occurrence of a signal loss due to signal reflection or signal radiation.

Next, embodiments of a wireless module according to the present disclosure will be described referring to the drawings. A wireless module of the embodiments is used for, for example, a high frequency in a millimeter-wave band of 60 [GHz] and has a configuration in which an antenna as a passive device and a semiconductor device as an active device are mounted.

First Embodiment

FIG. 1 is a longitudinal cross-sectional view of a wireless module 1 according to a first embodiment. The wireless module 1 has a first board 2 as a main board and a second board 3 as a sub-board. While any of the first board 2 and the second board 3 may be used as a main board and a sub-board, for simplification of description here, the first board 2 is used as a main board, and the second board 3 is used as a sub-board.

The first board 2 is formed using, for example, an insulating material of a dielectric having a dielectric constant of about 3 to 4, and has a multi-layered structure having at least two layers in which a first layer board 2a and a second layer board 2b are bonded together. In FIG. 1, while the two of the first layer board 2a and second layer board 2b are bonded together to form the first board 2, a multi-layered structure constituting the first board 2 is not limited to two layers.

A wiring pad 4a for electrically connecting a connecting member 8 described below and wiring patterns 15, 16 for electrically connecting a semiconductor device 7 as an electronic component (mounting component) of a wireless circuit are formed on one surface of the first layer board 2a. A spherical Cu core ball as the connecting member 8 solder-plated to the wiring pad 4a is mounted on one surface of the first layer board 2a.

The semiconductor device 7 is mounted on one surface of the first layer board 2a through the wiring patterns 15, 16. Although not shown in FIG. 1, in addition to the semiconductor device 7, a passive device, such as a chip capacitor or a chip resistor, may be mounted on one surface of the first layer board 2a.

A wiring pad 6a to be electrically connected to the wiring pad 4a through a through-via 5a, a wiring pad 6c to be electrically connected to the wiring pattern 15 through a through-via 5c, and a wiring pattern 13 electrically connecting the wiring pads 6a, 6c are formed on the other surface of the first layer board 2a.

The other surface of the second layer board 2b is bonded to the other surface of the first layer board 2a, and for example, a copper foil sheet-like ground pattern GND1 is formed on one surface of the second layer board 2b.

The second board 3 is formed using, for example, an insulating material of a dielectric having a dielectric constant of about 3 to 4, and has a single-layered structure. Similarly to the first board 2, the second board 3 may have a multi-layered structure. A wiring pad 4b for electrically connecting the connecting member 8 and, for example, a copper foil sheet-like ground pattern GND2 are formed on one surface of the second board 3. The connecting member 8 by the Cu core ball solder-plated to the wiring pad 4b is mounted on one surface of the second board 3. The wiring pad 4b and the ground pattern GND2 are not electrically connected together.

A wiring pad 6b to be electrically connected to the wiring pad 4b through a through-via 5b, for example, a copper foil pad-like antenna 9, and a wiring pattern 14 electrically connecting the wiring pad 6b and the antenna 9 are formed on the other surface of the second board 3.

The first board 2 and the second board 3 are arranged such that one surface of the first layer board 2a of the first board 2 and one surface of the second board 3 face each other, and are electrically connected together through the Cu core ball as the connecting member 8 solder-plated to the wiring pads 4a, 4b. The connecting member 8 becomes a signal transmission path (signal line path) between a wireless circuit (for example, the semiconductor device 7) in the first layer board 2a of the first board 2 and the antenna 9 in the second board 3.

Further, the connecting member 8 is provided so as to form a gap allowing mounting of an electronic component, such as the semiconductor device 7, between the first board 2 and the second board 3. Seal resin 10 such as mold resin, is filled in the buried layer having the semiconductor device 7 between the first board 2 and the second board 3 to seal the space between the first board 2 and the second board 3.

The diameter of the Cu core ball as the connecting member 8 is determined depending on the height of an electronic component (for example, the semiconductor device 7)

mounted in the buried layer between the first board 2 and the second board 3, and is, for example, 200 [μm]. In this case, the diameter z of each of the wiring pads 4a, 4b is greater than the diameter of the connecting member 8 so as to allow the mounting of the connecting member 8, and is, for example, 300 [μm] (see FIG. 2).

In the wireless module of the related art described above, the wiring pad on which the connecting member (Cu core ball) for electrically connecting the first board and the second board is mounted is coupled to the ground layer with the dielectric layer having a thickness of 50 [μm] interposed therebetween. Accordingly, in the input/output impedance in the signal path of the high-frequency signal in the wireless module, the capacitive component with respect to the ground layer increases, and impedance discontinuity occurs.

Figure 2:
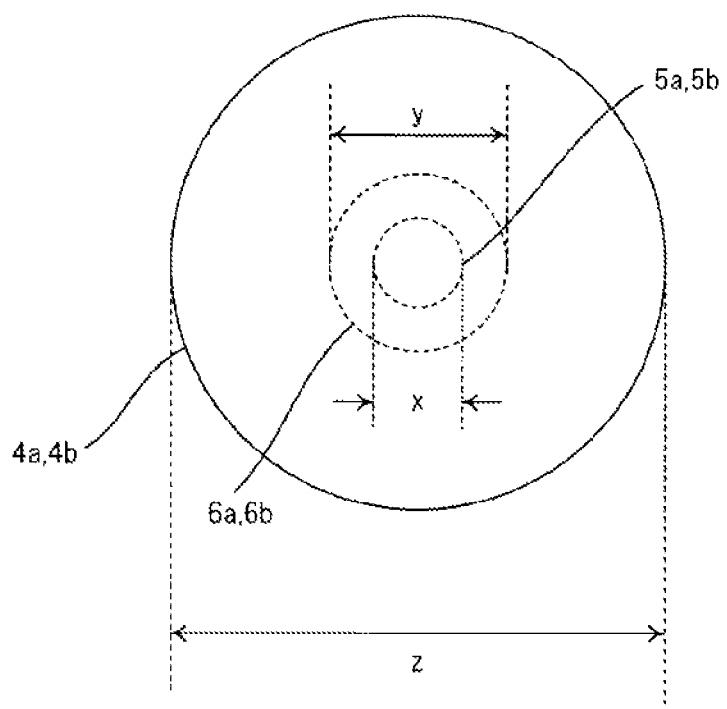
FIG. 2 is an explanatory view showing the state of each diameter of a small-diameter wiring pad, a large-diameter wiring pad, and a through-via.

In the wireless module 1 of this embodiment, compared to the wireless module of the related art, a combination of two large and small wiring pads (for example, 4a, 6a) having different diameters is provided, and a large-diameter wiring pad (4a, 4b) and a small-diameter wiring pad (6a, 6b) are electrically connected together through a through-via (5a, 5b) (see FIG. 2). FIG. 2 is an explanatory view showing aspects of diameters of a small-diameter wiring pad (6a, 6b), a large-diameter wiring pad (4a, 4b), and a through-via.

In the wireless module 1 of this embodiment, the small-diameter wiring pad (6a, 6b) is coupled to the ground layer (GND1, GND2) with the dielectric layer having a thickness of 50 [μm] interposed therebetween. Specifically, in FIG. 1, the thickness of each of the second layer board 2b and the second board 3 is 50 [μm].

The diameter x of the through-via 5a is 50 [μm] (or 100 [μm]), and the diameter y of each of the small-diameter wiring pads 6a, 6b is 80 [μ] (or 120 [μm]) smaller than the diameter z of each of the large-diameter wiring pads 4a, 4b.

Accordingly, in regard to impedance of the connecting member 8 as a signal path in the wireless module 1, since the area of the wiring pad (6a, 6b) coupled to the ground layer (GND1, GND2) is ⅑ (or ¼), it is possible to reduce the capacitive component with respect to the ground layer (GND1, GND2) compared to a case where the ground layer (GND1, GND2) and the wiring pad (4a, 4b) are coupled together, and to suppress the occurrence of impedance discontinuity.

With the above, in the wireless module 1 of this embodiment, two large and small wiring pads having different diameters are provided, the large-diameter wiring pad and the small-diameter wiring pad are electrically connected together through the through-via, and the small-diameter wiring pad and the ground layer are coupled together.

Accordingly, in the wireless module 1, it is possible to confine the electromagnetic field of a high-frequency signal in the dielectric layer between the small-diameter wiring pad and the ground layer compared to a case where the large-diameter wiring pad and the ground layer are coupled together to increase the thickness of the dielectric layer, and to reduce a signal loss due to signal reflection or signal radiation.

That is, in the wireless module 1, it is possible to suppress the occurrence of impedance discontinuity in a high-frequency circuit, and to suppress a signal loss due to impedance discontinuity and signal reflection or signal radiation.

Next, the background art and the problem as a premise of a wireless module according to a second embodiment will be described.

In the related art, an imaging apparatus is known, in which a semiconductor chip having a high-frequency circuit with a transmitter generating a high-frequency signal and a patch antenna formed on one surface of a semiconductor board is mounted on a MMIC (Monolithic Microwave Integrated Circuits) board (see Reference Patent Literature 1).

Reference Patent Literature 1: JP-A-2004-205402

There are many cases, however, where the patch antenna and the high-frequency circuit are different in height in the thickness direction of the board. In this case, when mounting a module board on another board, if the module board is picked up from the mounting surface of the patch antenna, the tip of a pickup tool (suction apparatus) may interfere with an electronic component (for example, the high-frequency circuit including the transmitter).

Thus, in an example of the second embodiment, a wireless module in which, even when an electronic component is mounted on an antenna mounting surface of a wireless module, the wireless module can be easily picked up from the antenna mounting surface will be described.

Second Embodiment

Figure 3:
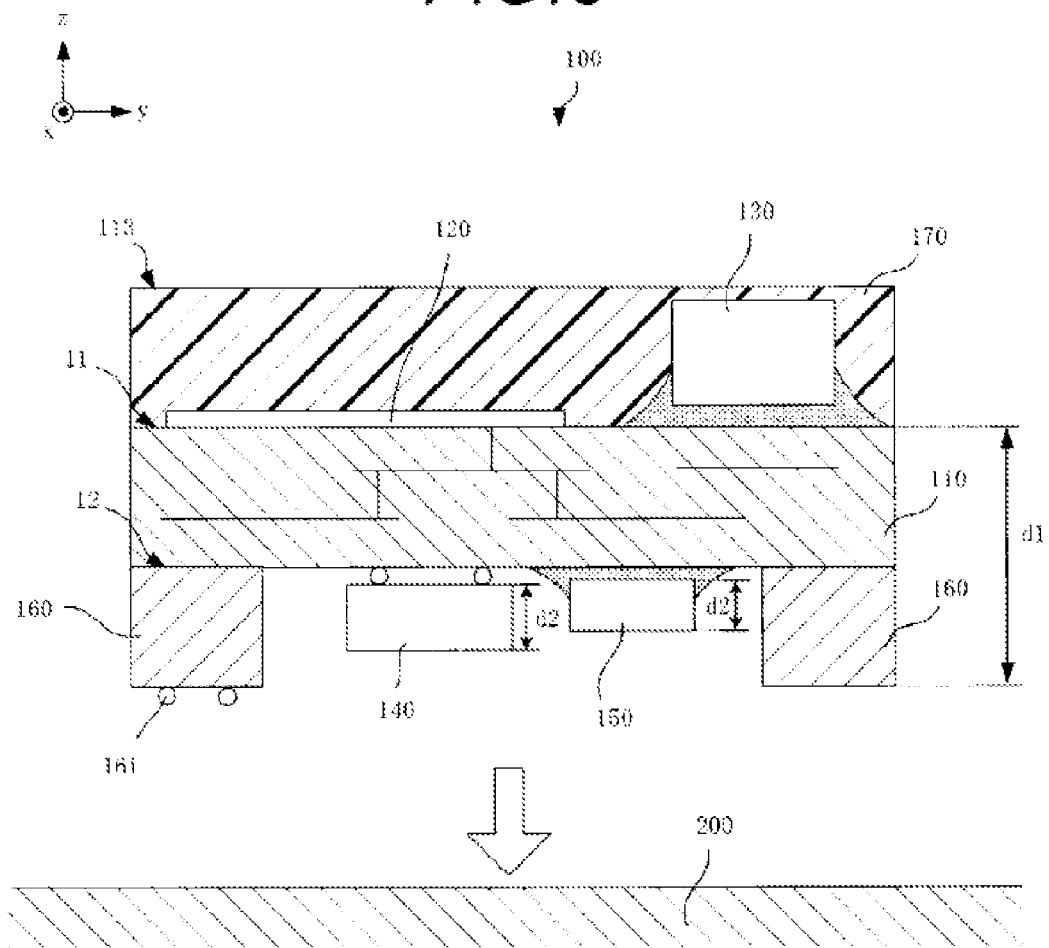
FIG. 3 is a cross-sectional side view showing a configuration example of a wireless module according to a second embodiment.

FIG. 3 is a cross-sectional side view showing a configuration example of a wireless module 100 according to a second embodiment.

In a wireless module 100 shown in FIG. 3, a module board 110 is a multi-layered board, and wiring of an IC or the like is performed. Electronic components, such as an antenna unit 120 and a Tcxo 130 (Temperature compensated crystal Oscillator), are mounted on a first surface 11 (in FIG. 3, an upper surface) of the module board 110. Accordingly, the first surface 11 is an antenna mounting surface on which the antenna unit 120 is provided.

The antenna unit 120 is, for example, a patch antenna which is formed by an antenna pattern using wiring. Electronic components, such as a chip component 140 including an RLC and an IC component 150, are mounted on a second surface 12 (in FIG. 3, a lower surface) of the module board 110.

The wireless module 100 is mounted on a set board 200. In this case, the second surface 12 of the module board 110 comes into contact with the mounting surface of the set board 200. A frame board 160 is arranged on the second surface 12 of the module board 110 such that the set board 200 does not come into direct contact with the electronic components mounted on the second surface 12. The frame board 160 has, for example, a square shape and is arranged in a circumferential end portion of the second surface 112 of the module board 110. In this case, the wireless module 100 has a cavity type structure by the module board 110 and the frame board 160. The module board 110 may be constituted by a single-layered board instead of a multi-layered board.

An electrode 161 of the frame board 160 is soldered to the set board 200, and physically and electrically connected to the set board 200. Accordingly, electrical conduction is provided between the frame board 160 as well as the module board 110 and the set board 200 to allow signal transmission.

A length d1 in the board thickness direction (in FIG. 3, z direction) of the module board 110 and the frame board 160 is, for example, about 1 mm. A length d2 in the component thickness direction (in FIG. 3, the z direction) of the chip component 140 or the IC component 150 is, for example, about 0.2 to 0.3 mm. Even if the wireless module 100 including the frame board 160 is mounted on the set board 200, the electronic components mounted on the module board 110 do not come into contact with the set board 200.

On the first surface 11 of the module board 110, the electronic components, such as the antenna unit 120 and the Tcxo 130, are molded integrally by a mold member (for example, mold resin), and a molded portion 170 is formed. The molded portion 170 surrounds the antenna unit 120 and the peripheral electronic component. There is no particular restriction to the mold member, and it should be noted that a mold member having a small dielectric, tangent (tan δ) has little electric loss in the molded portion 170.

In this embodiment, when the wireless module 100 is mounted on the set board 200, the wireless module 100 is picked up from the first surface 11 of the module board 110 by a pickup apparatus and mounted on the set board 200. Accordingly, the molded portion 170 is picked up, whereby it is possible to prevent interference during pickup due to the step between the antenna unit 120 and the electronic component provided on the first surface 11, and it becomes easy to pick up the wireless module 100.

It is desirable that a circumferential end surface 113 (ceiling surface) of the molded portion 170 is in parallel to the module board 110 and kept flat. Accordingly, the wireless module 100 can be more easily picked up by absorption.

In this way, the wireless module 100 of this embodiment is a wireless module which is picked up from the first surface 11 as the antenna mounting surface having the antenna unit 120 mounted thereon. The wireless module 100 includes the module board 110 on which the antenna unit 120 is mounted, and the molded portion 170 in which the electronic component including the antenna unit 120 is molded on the first surface 11 of the module board 110. Accordingly, certainty of suction by the pickup tool is improved. That is, even when an electronic component is mounted on an antenna mounting surface of a wireless module, the wireless module can be easily picked up from the antenna mounting surface.

Third Embodiment

Figure 4:
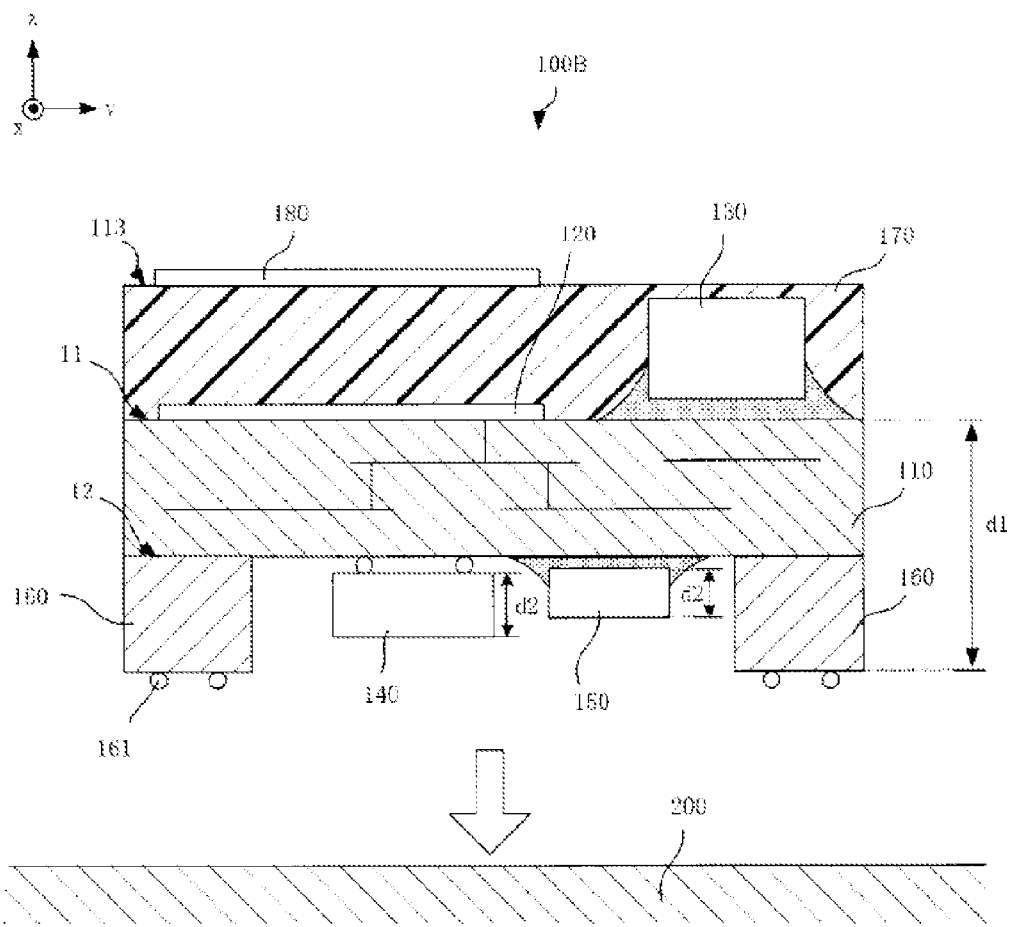
FIG. 4 is a cross-sectional side view showing a configuration example of a wireless module according to a third embodiment.

FIG. 4 is a cross-sectional side view showing a configuration example of a wireless module according to a third embodiment.

A wireless module 100B shown in FIG. 4 is different from the wireless module 100 shown in FIG. 1 in that the wireless module 100B includes a waveguide unit 180.

As shown in FIG. 4, the waveguide unit 180 is provided on the circumferential end surface 113 (molded surface) of the molded portion 170 and supports transmission and reception of electric waves by the antenna unit 120. The waveguide unit 180 is formed by for example, a conductor pattern which functions as a wave director.

Usually, since the mold resin forming the molded portion 170 does not take into consideration the antenna characteristics, the mold resin is an undesirable dielectric when viewed from the antenna unit 120. Although the antenna unit 120 is formed assuming air (dielectric, constant ∈=1), resin having a dielectric constant ∈=3 to 4 surrounds the antenna, whereby change in the characteristic of the antenna may occur. The wireless module 100B includes the waveguide unit 180, thereby readjusting the antenna characteristic and maintaining the antenna characteristic in a favorable state.

As a position at which the waveguide unit 180 is provided on the molded portion 170, the following three patterns are considered.

Figure 5:
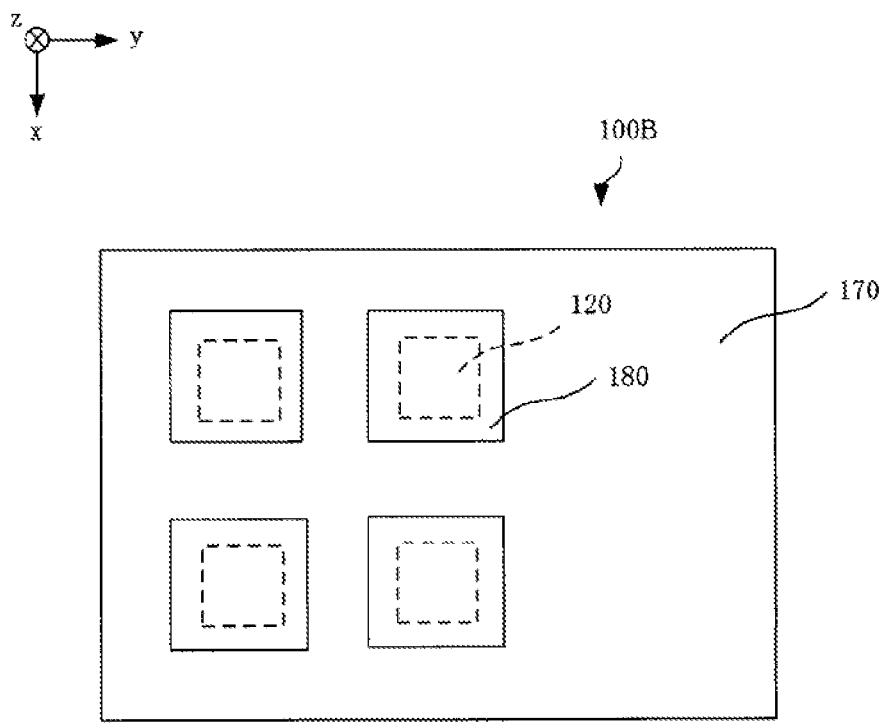
FIG. 5 is a top view showing a first example of the positional relationship between an antenna unit and a waveguide unit of a wireless module according to the third embodiment.

FIG. 5 is a top view showing a first example of the positional relationship between the antenna unit 120 and the waveguide unit 180 of the wireless module 100B according to the third embodiment.

In the first example, the waveguide unit 180 is provided at a position facing the antenna unit 120 on the circumferential end surface 113 of the molded portion 170. Accordingly, loss of power transmitted or received through the antenna unit 120 is minimized, and transmission and reception of electric waves can be favorably performed. That is, it is possible to improve certainty of suction by the pickup tool and to maintain the antenna characteristic in a favorable state. On the circumferential end surface 113 of the molded portion 170, the waveguide unit 180 is provided outward of the molded portion 170.

In the example shown in FIG. 5, the antenna unit 120 has a 2×2 array configuration on the first surface 11 of the module board 110. Similarly, the waveguide unit 180 has a 2×2 array configuration on the circumferential end surface 113 of the molded portion 170. The antenna unit 120 and the waveguide unit 180 have a 2×2 array configuration, making it easy to perform phase composition or amplitude composition. The 2×2 array configuration of the antenna unit and the waveguide unit 180 is an example, and a single pattern may be provided or more patterns may be arranged in a lattice shape. The arrangement of multiple patterns ensures a favorable antenna characteristic.

The waveguide unit 180 shown in FIG. 5 is provided, and a pattern which functions as the waveguide unit 180 of the molded portion 170 appropriately changes without redesigning the module board 110, thereby changing an antenna gain or the frequency characteristic of the antenna gain. Although pattern cut of the antenna unit 120 for adjusting manufacturing variation after molding is difficult, the pattern cut of the antenna unit 120 becomes possible by cutting the pattern on the molded portion 170.

Since the molded portion 170 is provided to cause an increase in the thickness (in FIG. 4, the length in the z direction) of a dielectric layer having a dielectric constant higher than air, it is preferable that the waveguide unit 180 is greater than the antenna unit 120. That is, it is preferable that a region where the waveguide unit 180 is provided on the molded surface of the molded portion 170 is greater than a region where the antenna unit 120 is provided on the antenna mounting surface. Accordingly, it is possible to further favorably adjust the antenna characteristic.

Figure 6:
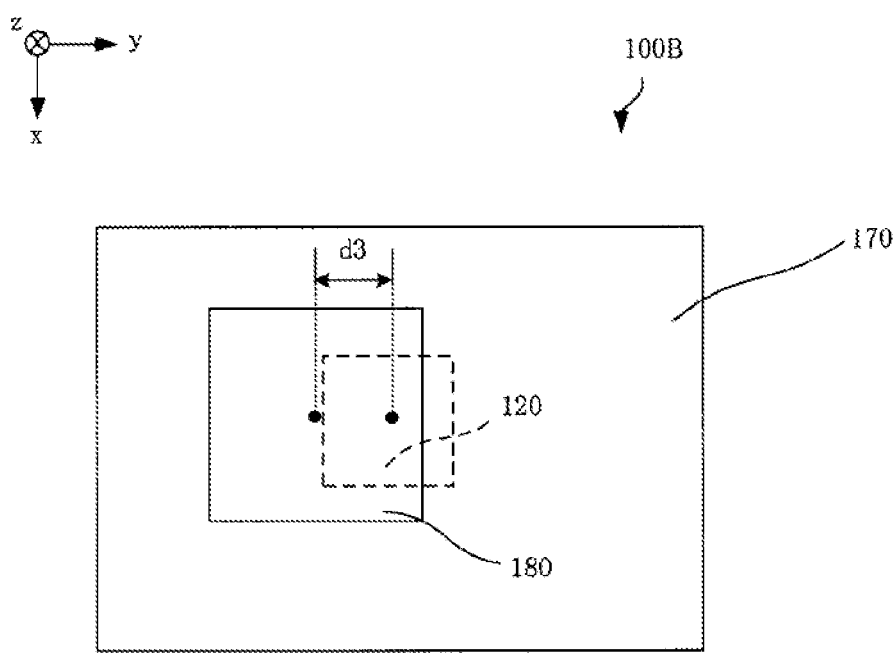
FIG. 6 is a top view showing a second example of the positional relationship between an antenna unit and a waveguide unit of the wireless module according to the third embodiment.

FIG. 6 is a top view showing a second example of the positional relationship between the antenna unit 120 and the waveguide unit 180 of the wireless module 100B according to the third embodiment.

In the second example, the waveguide unit 180 is provided at a position away from a position facing the antenna unit 120 on the circumferential end surface 113 of the molded portion 170 by a predetermined distance d3. That is, the position on the molded surface of the waveguide unit 180 is deviated (offset) from the position on the antenna mounting surface of the antenna unit 120.

For example, as shown in FIG. 6, when the waveguide unit 180 is on the left side from the antenna unit 120, electric waves are radiated in the left direction. When the waveguide unit 180 is on the right side from the antenna unit 120, electric, waves are radiated in the right direction. In this way, the waveguide unit 180 is arranged so as to be deviated in a direction to radiate electric waves.

The waveguide unit 180 is provided to change the pattern on the circumferential end surface 113 of the molded portion 170 without redesigning the module board 110, thereby changing antenna directionality (tilting beams). Even after the antenna unit 120 is mounted on the module board 110, it is possible to flexibly change antenna directionality.

Figure 7:
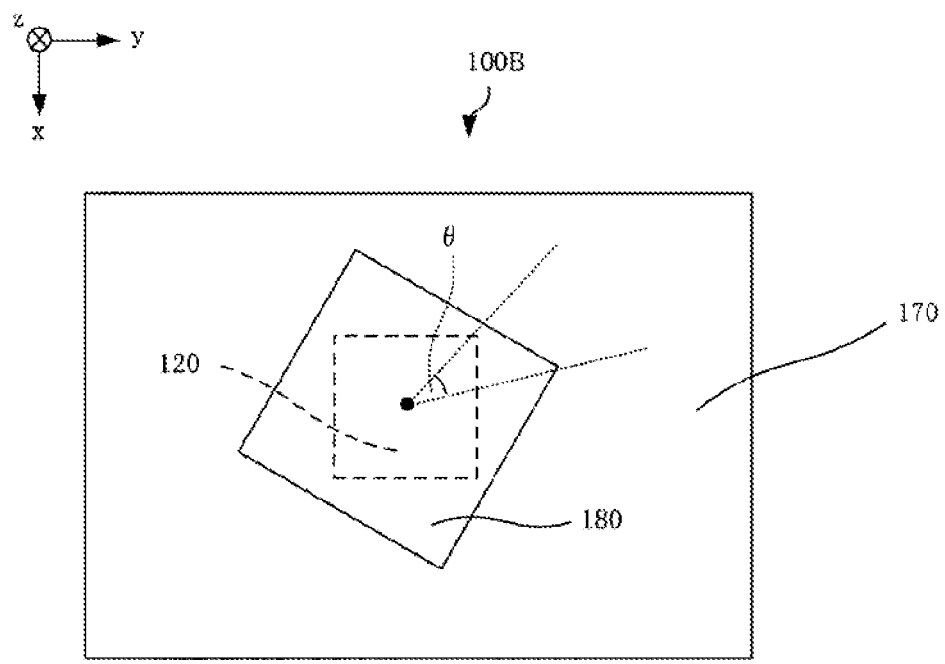
FIG. 7 is a top view showing a third example of the positional relationship between an antenna unit and a waveguide unit of the wireless module according to the third embodiment.

FIG. 7 is a top view showing a third example of the positional relationship between the antenna unit 120 and the waveguide unit 180 of the wireless module 100B according to the third embodiment.

In the third example, as shown in FIG. 7, on the circumferential end surface 113 of the molded portion 170, the waveguide unit 180 is provided in a region rotated from a region, in which the antenna unit 120 is provided on the antenna mounting surface, by a predetermined rotation angle θ. That is, in FIG. 7, the waveguide unit 180 is mounted on the circumferential end surface 113 in a positional relationship that the direction of a rectangle representing the region of the waveguide unit 180 is rotated from the direction of a rectangle representing the region of the antenna unit 120. Accordingly, it is possible to change the polarization plane (antenna polarization plane) of electric waves radiated from the antenna unit 120.

The position of the waveguide unit 180 on the molded surface and the position (the position on the xy plane) of the antenna unit 120 on the antenna mounting surface are substantially identical. The rotation angle θ is an angle which is less than 90 degrees. The rotation angle θ is adjusted, whereby the antenna polarization plane can be made as a desired polarization plane according to the magnitude of the rotation angle θ. For example, the antenna polarization plane can be changed from a vertical polarization plane to a horizontal polarization plane, can be changed from a horizontal polarization plane to a vertical polarization plane, or can change linearly polarized waves to circularly polarized waves. The change in the antenna polarization plane can be realized by changing the pattern as the waveguide unit 180 on the circumferential end surface 113 of the molded portion 170 without redesigning the module board 110.

Instead of making the positional relationship between the waveguide unit 180 and the antenna unit 120 as a rotation-positional relationship, it may be desired such that the resonance frequency of the waveguide unit 180 and the resonance frequency of the antenna unit 120 are different from each other. With this, it is possible to change the antenna polarization plane.

For example, the resonance frequencies of the antenna unit 120 and the waveguide unit 180 are deviated slightly from each other such that the resonance frequency of the antenna unit 120 becomes 60 GHz and the resonance frequency of the waveguide unit 180 becomes 59.5 GHz, whereby the excitation timing differs slightly. Accordingly it is possible to change the antenna polarization plane.

Although various embodiments have been described referring to the drawings, it should be noted that the wireless module of the present disclosure is not limited to these examples. It is obvious to those skilled in the art that various modifications or corrections may be made within the scope described in the appended claims, and it is understood that these modifications or corrections still fall within the technical scope of the present disclosure.

Although in the foregoing embodiments, a combination of two large and small wiring pads having different diameters has been described, a combination of wiring pads is not limited to two large and small wiring pads, and for example, three large and small wiring pads may be used. In this case, the first board 2 or the second board 3 has a multi-layered structure according to the number of combinations of wiring pads.

Figure 8:
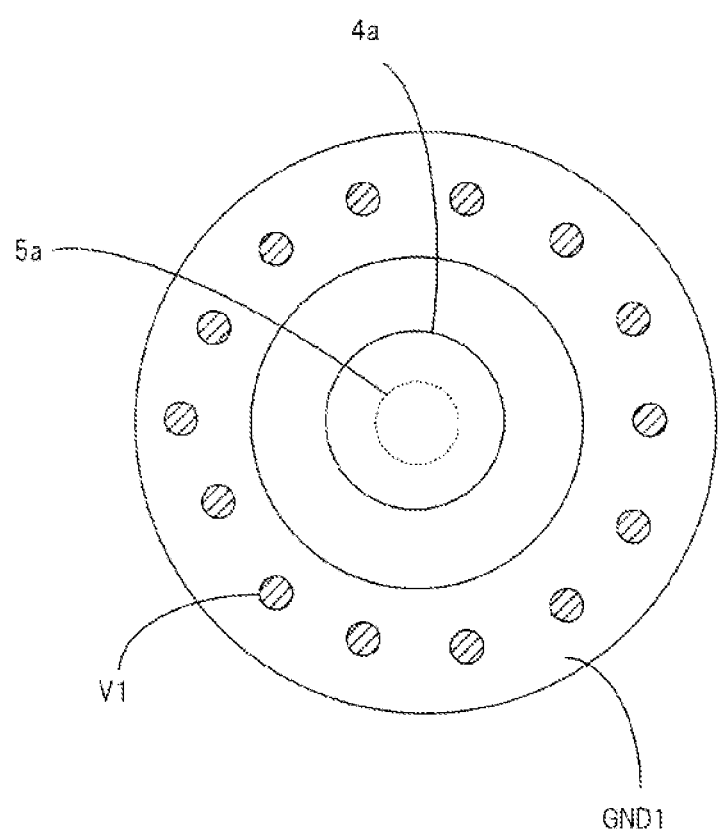
FIG. 8 shows an example of the shape of a wiring pad and a ground pattern connected to a through-via.
Figure 9:
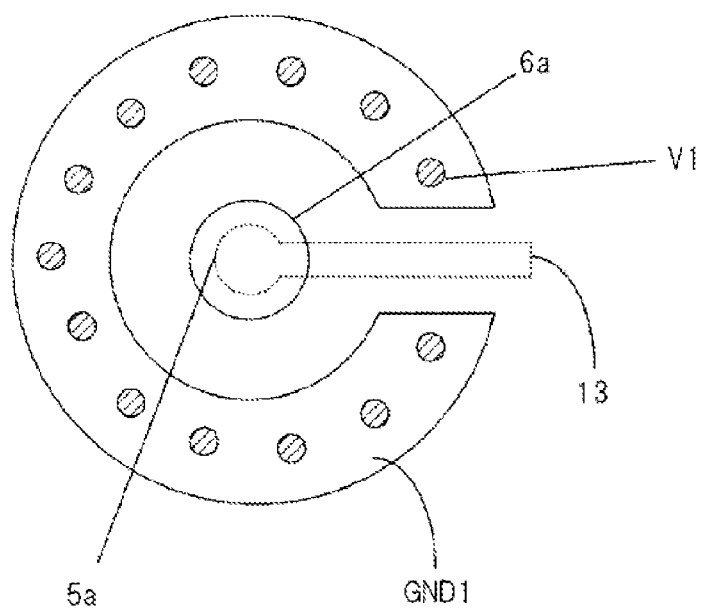
FIG. 9 shows an example of the shape of a wiring pad and a ground pattern connected to a through-via.

In the first embodiment, the ground pattern GND1 shown in FIG. 1 may have a shape surrounding the through-via 5a and the wiring pads 4a and 6a (see FIGS. 8 and 9). FIG. 8 shows an example of the shape of the wiring pad 4a and the ground pattern GND connected to the through-via 5a. FIG. 9 shows an example of the shape of the wiring pad 6a and the ground pattern GND1 connected to the through-via 5a.

Since the wiring pads 4a, 4b as pads for signals are not connected to the wiring patterns 13, 14 (see FIG. 1), the ground pattern GND1 has, for example, a circular shape as the shape surrounding the through-vias 5a and 5b and the wiring pads 4a, 4b (see FIG. 8). In FIG. 8, a plurality of through-vias V1 for connecting the ground pattern GND1 and the first layer board 2a or the second layer board 2b of the first board 2 are provided. Accordingly, in the wireless module, the ground pattern 101 and the ground pattern 102 can be at the same potential, and the periphery of a signal transmitting through the wiring pads 4a, 6a for signals and the through-via 5a is surrounded by the GND layer, thereby inhibiting signal radiation.

Figure 10:
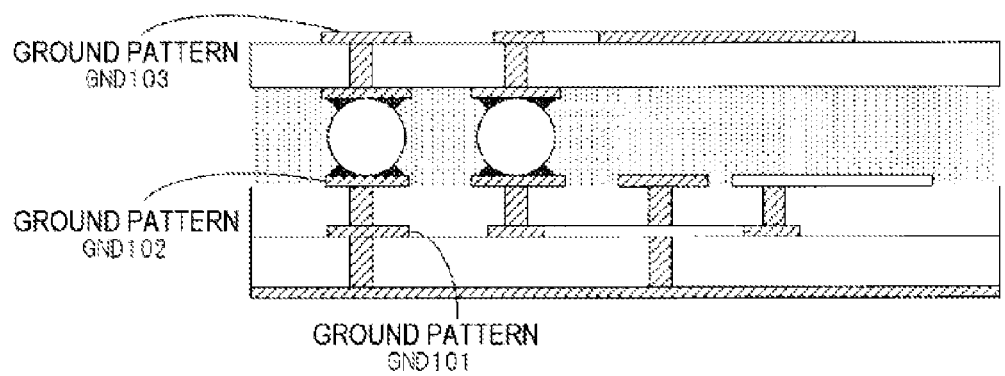
FIG. 10 is a longitudinal cross-sectional view of another wireless module.

The ground pattern GND1 is not limited to a circular shape and may have a rectangular shape or a polygonal shape. The wiring pad 4a shown in FIG. 8 may be ground patterns GND101, GND102, and GND103 in a wireless module shown in FIG. 10. FIG. 10 is a longitudinal cross-sectional view of another wireless module.

Since the wiring pads 6a, 6b for signals are connected to the wiring patterns 13, 14 (see FIG. 1), while the ground pattern GND1 surrounds the through-vias 5a, 5b and the wiring pads 6a, 6b, the ground pattern GND1 has a shape in which a part is notched toward the wiring patterns 13, 14. Similarly, in FIG. 9, a plurality of through-vias V1 which connect the ground pattern GND1 and the second layer board 2b of the first board 2 are provided. Accordingly, in the wireless module, the ground pattern 101 and the ground pattern 102 can be at the same potential, and the periphery of a signal transmitting through the wiring pads 4a, 6a for signals and the through-via 5a is surrounded by the GND layer, thereby inhibiting signal radiation.

The present application is based on Japanese Patent Application No. 2011-266043 filed on Dec. 5, 2011, and Japanese Patent Application No. 2011-268042 filed on Dec. 7, 2011, the contents of which are incorporated herein by reference.

INDUSTRIAL APPLICABILITY

The present disclosure is useful for a wireless module capable of suppressing a signal loss due to impedance discontinuity and radiation when manufacturing a wireless module for a high-frequency band.

The present disclosure is useful for a wireless module or the like in which, even when an electronic component is mounted on an antenna mounting surface of a wireless module, the wireless module can be easily picked up from the antenna mounting surface.

REFERENCE SIGNS LIST 1, 100, 100B: wireless module
2: first board.
2a: first layer board
2b: second layer board
3: second board
4a, 4b, 6a, 6b, 6c: wiring pad
5a, 5b, 5c: through-via
7: semiconductor device
8: connecting member
9: antenna
10: seal resin
11: first surface (antenna mounting surface) of module board
12: second surface of module board
13, 14, 15, 16: wiring pattern
110: module board
113: circumferential end surface (molded surface) of molded portion
160: frame board 161: electrode
170: molded portion
180: waveguide unit
200: set board
GND1, GND2: ground layer

The invention claimed is:

1. A wireless module, comprising:
a first board including at least two-layered boards, in which an electronic component of a wireless circuit is mounted on one board and a ground layer is formed on the other board;
a second board laminated on the first board;
a second wiring pad provided on a bonded face of the one board and the other board and having a second diameter;
a connecting member provided between the first board and the second board at a gap allowing mounting of the electronic component, and forming a portion of an electrical connection between the first board and the second board, and having a third diameter larger than the second diameter of the second wiring pad;
a first wiring pad electrically connecting the first board and the connecting member, and having a first diameter larger than the second diameter of the second wiring pad; and
a first via member provided inside the one board included in the first board, and connected to the first wiring pad and the second wiring pad, and having a fourth diameter smaller than the second diameter of the second wiring pad,
wherein the ground layer is formed on an opposite face of the bonded face.

2. The wireless module according to claim 1, further comprising:
a third wiring pad electrically connecting the second board and the connecting member, and having the same diameter as the first diameter; and
a fourth wiring pad provided on an opposite side to the third wiring pad of the second board and having a diameter smaller than the second diameter, wherein
a second ground layer is formed on an opposite side to the fourth wiring pad of the second board, and
a second via member provided inside the second board, and connecting to the third wiring pad and the fourth wiring pad, and having the fourth diameter.

3. The wireless module according to claim 1, further comprising:
a plurality of via members which connect the ground layer to the first board, wherein
the ground layer has a predetermined shape surrounding the first wiring pad.

4. The wireless module according to claim 1, further comprising:
a first wiring pattern connected to the electronic component;
a fifth wiring pad provided on the bonded face of the one board and the other board, and connected to the first wiring pattern through a second via member; and
a second wiring pattern electrically connecting between the second wiring pad and the fifth wiring pad.

5. The wireless module according to claim 1, wherein the connecting member is a Cu core ball.

* * * * *